United States Patent [19]
Akeley et al.

[11] Patent Number: 5,819,017
[45] Date of Patent: Oct. 6, 1998

[54] APPARATUS AND METHOD FOR SELECTIVELY STORING DEPTH INFORMATION OF A 3-D IMAGE

[75] Inventors: Kurt Akeley, Mountain View; James Foran, Milpitas, both of Calif.

[73] Assignee: Silicon Graphics, Inc., Mountain View, Calif.

[21] Appl. No.: 517,592

[22] Filed: Aug. 22, 1995

[51] Int. Cl.[6] .................................................. G06T 15/00
[52] U.S. Cl. .......................................... 395/122; 395/121
[58] Field of Search ..................................... 395/118, 119, 395/122, 121, 123, 126

[56] References Cited

U.S. PATENT DOCUMENTS

| | | | |
|---|---|---|---|
| 4,855,938 | 8/1989 | Gonzalez-Lopez et al. | 395/122 |
| 4,951,232 | 8/1990 | Hannah | 395/122 |
| 5,265,199 | 11/1993 | Catlin | 395/122 |
| 5,542,025 | 7/1996 | Brown | 395/122 |

OTHER PUBLICATIONS

Haeberli et al., "The Accumulation Buffer: Hardware Support For High Quality Rendering", Aug. 1990, Computer Graphics, vol. 24 No. 4.

Salesin et al., "The ZZ Buffer: A Simple And Efficient Rendering Algorithm With Reliable Antialiasing", Sep. 1989, Proceedings of the 2nd International Conference, PIXIM 89, Computer Graphics In Paris, France, 1989.

*Primary Examiner*—Heather R. Herndon
*Assistant Examiner*—Cliff N. Vo
*Attorney, Agent, or Firm*—Wagner, Murabito & Hao

[57] ABSTRACT

In a computer system for creating images of three-dimensional objects, an apparatus and method for processing depth values representing the relative depths of the objects. The depth values are transformed according to projections in order to give the appearance of depth when the objects are displayed on a two-dimensional computer screen. These transformed depth values are then interpolated using N bits of precision. Next, the depth values are encoded into a format whereby the depth values have less than N bits. These encoded depth values are stored into memory. In displaying the objects, the encoded depth values are read from memory and compared to determine the relative depths of the objects.

22 Claims, 7 Drawing Sheets

APPARATUS AND METHOD FOR SELECTIVELY STORING DEPTH INFORMATION OF A 3-D IMAGE

FIELD OF THE INVENTION

The present invention pertains to the field of three-dimensional computer graphics. More particularly, the present invention relates to an apparatus and method for selectively storing depth information at varying degrees of resolution in order to minimize the amount of memory required and the bandwidth.

BACKGROUND OF THE INVENTION

Today, computer graphics is being used in a wide variety of applications, such as in business, science, animation, simulation, computer-aided design, process control, electronic publication, etc. In its most rudimentary form, a simple computer-generated object can be specified by its vertices. For example, FIG. 1 shows a computer screen 100 displaying a polygon 101. Polygon 101 is represented by its three vertices 110–112. The edges of polygon 101 are determined by interpolating straight lines 120–122 from the vertices. For example, edge 122 is found by interpolating vertices 110 and 112. A scan conversion procedure is then performed to determine which of the pixels of screen 100 fall inside polygon 101.

The polygon 101 shown in FIG. 1 is two-dimensional. It has width and height, but no depth. In order to portray a more realistic, three-dimensional object onto a two-dimensional computer screen, the illusion of depth must be supplied. This illusion is created through the use of projections. Projections transform three-dimensional objects onto a two-dimensional projection plane. The conversion process for displaying a three-dimensional object in a two-dimensional computer screen entails specifying a view volume in the world, a projection onto the projection plane, and a viewport on the view surface. Basically, objects in the three-dimensional world are clipped against the three-dimensional view volume. There-upon, the object is projected onto the projection plane and then transformed or "mapped" into the viewport for display.

When images obtain the attribute of depth, there needs to be some mechanism for tracking the relative depths of each of the displayed objects. The most common method for tracking depths is to assign depth values, commonly referred to as "Z values." By assigning Z values, the computer system knows the depths at which picture elements, or pixels, are to be displayed. In addition, Z values are compared to resolve obscuring surfaces. This is demonstrated in FIG. 2 which shows a triangle 201 partially obscuring square 202. By comparing the Z values of triangle 201 to those of square 202, the computer system knows to remove the obscured portion of square 202. Z buffering is critical for achieving visual realism. U.S. Pat. No. 4,951,232 entitled "Method for Updating Pipelined, Single Port Z-Buffer by Segments on a Scan Line," provides good background material on Z buffering.

When a three-dimensional image is rendered for display on a two-dimensional screen, not only do the X and Y coordinates need to be transformed, but the Z values must also similarly be transformed. Once the Z values corresponding to the vertices have been transformed, the intermediate depths of the pixels and/or subpixels within the triangles must be determined. It is highly desirable that these intermediate, transformed Z values be calculatable by simple interpolation from the vertices. Thus, it is essential that straight lines in the eye coordinate system transform into straight lines in the screen coordinate system. Likewise, planes need to transform into planes. The transformation process is described in ample detail in the book, *Principles of Interactive Computer Graphics*, Newman and Sproull, McGraw-Hill, 1979.

An example of a three-dimensional display is shown in FIG. 3. A series of rectangles as they are tilted "back" at varying degrees towards the line of view are shown. It is clear that the rectangles' vertices are transformed when the rectangles are perspectively rendered. In other words, the X and Y coordinates of the vertices are changed. Similarly, the Z values associated with the vertices are also transformed. This transformation is highlighted by examining the midpoint between the top and bottom of polygons 301–303. The midpoint, as defined in screen or "window" coordinates, is given as the dashed line 304. In contrast, from a viewer's perspective, the midpoint of polygon 301 is given at 305; the midpoint of polygon 302 is given at 306; and the midpoint of polygon 303 is given at 307. Clearly, if the Z values were not correctly transformed, there would be errors in the depth values of the pixels being displayed.

However, there is a problem associated with transforming Z values. When Z values are transformed, there is a dramatic non-linear "warping" effect. Upon transformation, the transformed Z values associated with those images that are closer to the viewer represent smaller distances, whereas the transformed Z values of images that are far away from the viewer represent greater distances. Referring to FIG. 3, it is intuitive that the "viewer" distance represented by $Z_2$ is greater than that of $Z_1$. Supposing, for example, that each discrete Z value initially represents 2 feet of depth. After transformation, Z, might represent 2.2 feet, whereas $Z_2$ might represent 200 feet.

The "warping effect" grows more pronounced as the ratio of the near plane depth to the far plane depth increases. This phenomenon is demonstrated by comparing the depth representations of the near field (the shaded portion) to that of the far field (the clear portion) associated with polygons 301–303. Clearly, as the rectangle is tilted more towards the line of view (i.e., more depth), the near field becomes larger and the far field becomes smaller. Clearly, the viewer distance represented by $Z_3$ is greater than that of $Z_2$. And the viewer distance represented by $Z_4$ is even greater than that of $Z_3$. Thus, as the ratio of the near plane to far plane increases, the degree by which the near field gains resolution and the far field loses resolution, becomes more severe.

In many instances, the degradation of depth resolution in the far field is of great concern. For example, in rendering simulation scenes, one would like to display objects that are two feet in front of the view as well as objects that are 50 miles away from the viewer. Under these conditions, a computer system would need 132,000 discrete Z values, whereby each Z value represents 2 feet. This means that 17 bits of digital data is required to cover these Z values. However, due to the non-linear transformation process, approximately 1 bit of resolution is lost for every factor of two that the near-to-far plane ratio increases. Hence, ½ of the depth in the scene has only 1 bit resolution; ¾ of the depth in that scene has 2 bits of resolution; ⅞ths of the depth in that scene has 3 bits of resolution; etc. In other words, for ⅞ths of the scene, 14 bits of resolution are lost. Thus, in this example, the last 25 miles of the scene is represented by a single Z value. This means that an object which is only 26 miles away from the viewer would have the same transformed Z value as an object that is 50 miles away from the viewer. Although the first object is in front of the second object, the computer has no way of knowing this because the two objects have the same Z value. As a result, the three-dimensional image would have many inaccuracies in the far field. Further aggravating the problem is the fact that much of the scene exists in the far field.

One solution to compensate for the loss of resolution is to assign more bits in order to enhance the precision of the Z values. However, this solution requires additional memory in order to store the increased number of bits. Given that a screen is constructed from millions of pixels, each of which has corresponding Z values, the large amount of memory to store all of the Z bits can be rather expensive. Indeed, each pixel may have multiple subsamples, whereby each of the sub-samples has its own Z value. Furthermore, it takes time to write the additional Z bits into memory and then read them back out of the memory. Hence, valuable bandwidth is consumed and images cannot be displayed and updated as quickly as desired.

Another solution is to have the Z values be represented by floating point numbers. Precision is packed in one place in floating point. The near plane can be designated as 1, with the far plane assigned a value of 0. Hence, one can favor that precision be packed into the far field. However, the disadvantage to using this mechanism is that it is very expensive to perform the necessary interpolations and calculations in floating point format.

Thus, there is a need for an apparatus and method that offers a high degree of resolution in the far field, has the property of being linearly interpolatable in the X, Y, and Z coordinates after transformation, and is conservative in its memory requirements for storing the Z values.

SUMMARY OF THE INVENTION

The present invention pertains to an apparatus and method for creating computer-generated three-dimensional images. More specifically, the present invention relates to how depth values are processed. Depth values are used to represent the relative depths of the images. In order to give the appearance of depth, the three-dimensional images are transformed and projected onto a two-dimensional display screen. The depth values are similarly transformed. These transformed depth values are interpolated to determine the intermediate depths of the primitives defining a particular image. The interpolation process uses N bits of precision.

Next, the depth values are encoded into a format whereby the depth values have less than N bits. These smaller encoded depth values are stored into memory. In generating the images, the encoded depth values are read from memory and compared to determine the relative depths of the images. By using a greater number of bits in the interpolation process, the warping effect that is inherent to the transformation process can be compensated. However, by encoding the depth values into a format having a lesser number of bits, the depth values can be stored in a more efficient manner. Furthermore, bandwidth is conserved because there are less number of bits that need to be written into and read from the memory. Hence, images can be rendered more quickly.

Many different types of encoding schemes can be used in the present invention. In the currently preferred embodiment, depth values corresponding to images that are far away from the viewer are encoded with less compaction than those depth values that are closer to the viewer.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

An apparatus and method for compressing depth information of a high resolution three-dimensional image is disclosed. In the following description, for purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring the present invention.

Figure 1:
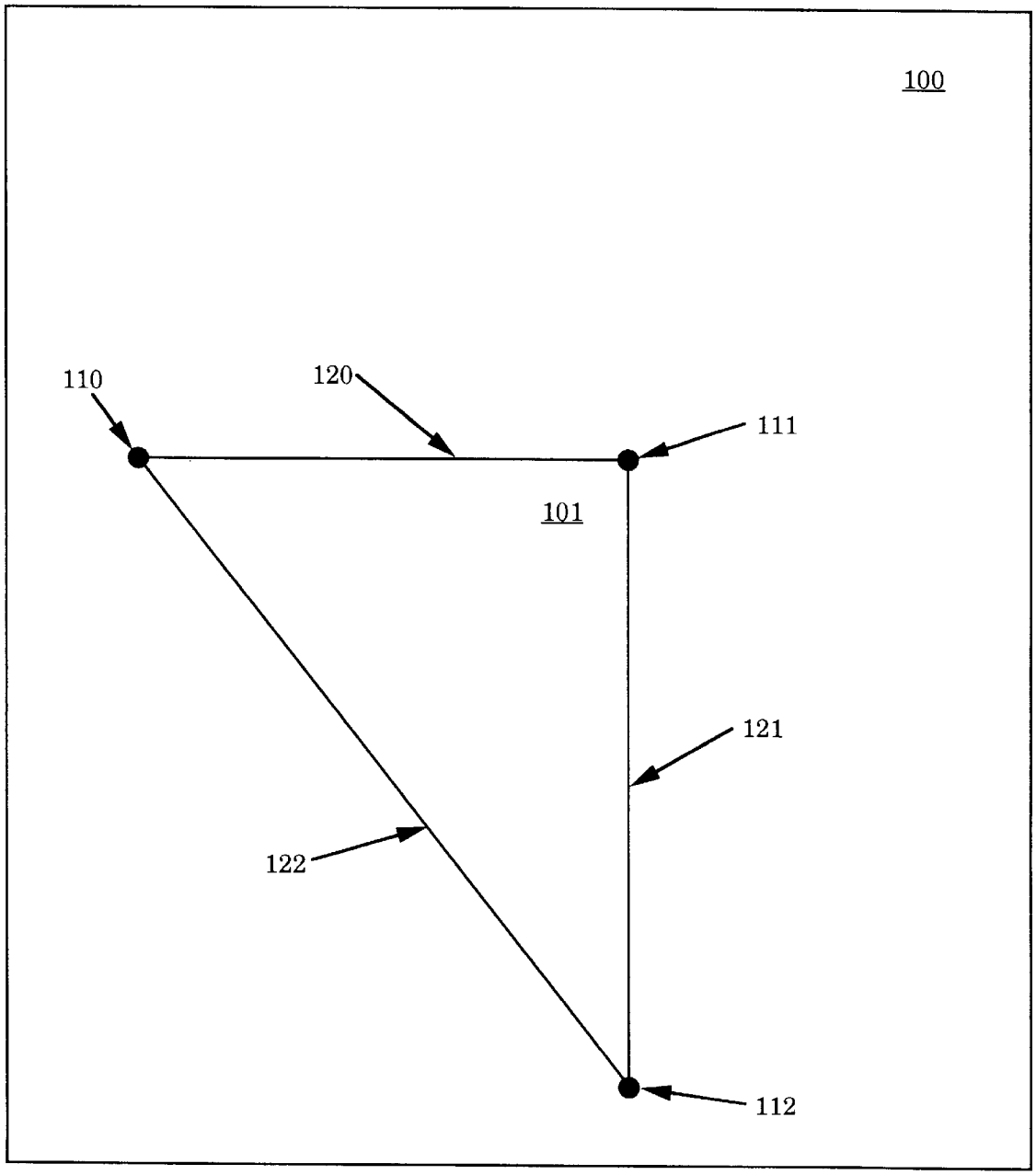
FIG. 1 shows a computer screen displaying a polygon represented by its vertices.
Figure 2:
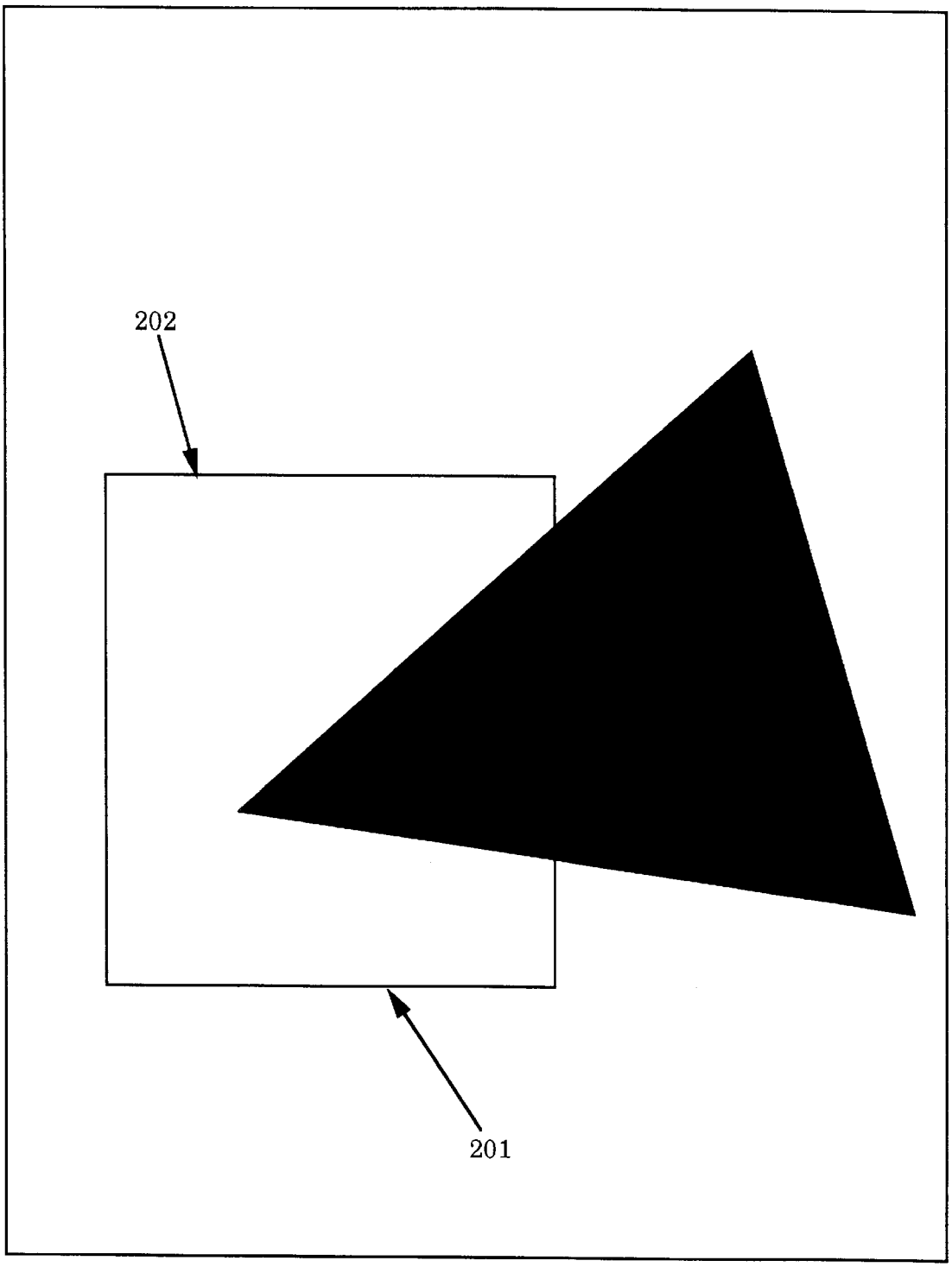
FIG. 2 shows a triangle that partially obscures a square behind the triangle.
Figure 3:
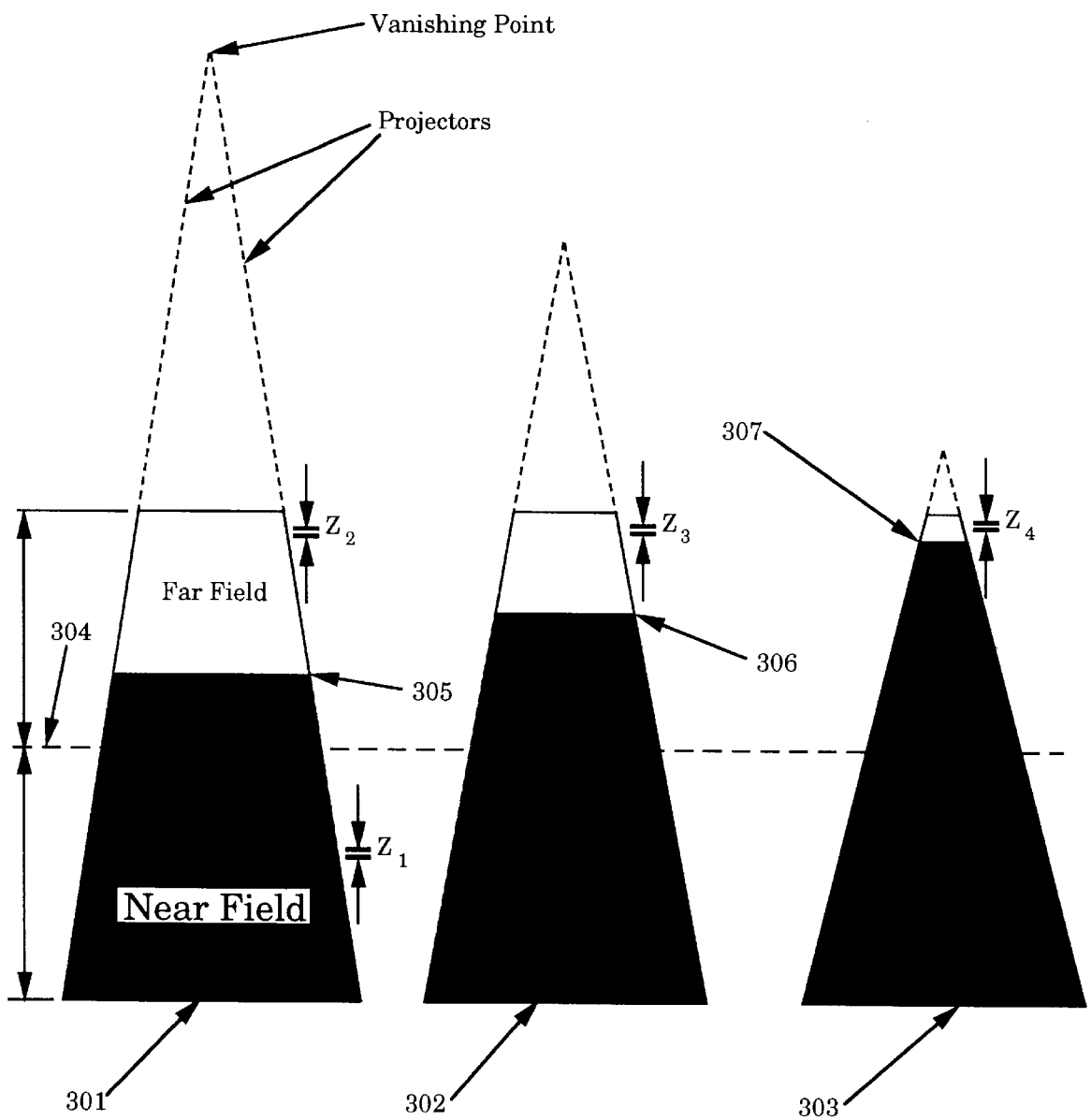
FIG. 3 shows the rectangle as it is projected back, giving the perception of depth.
Figure 4:
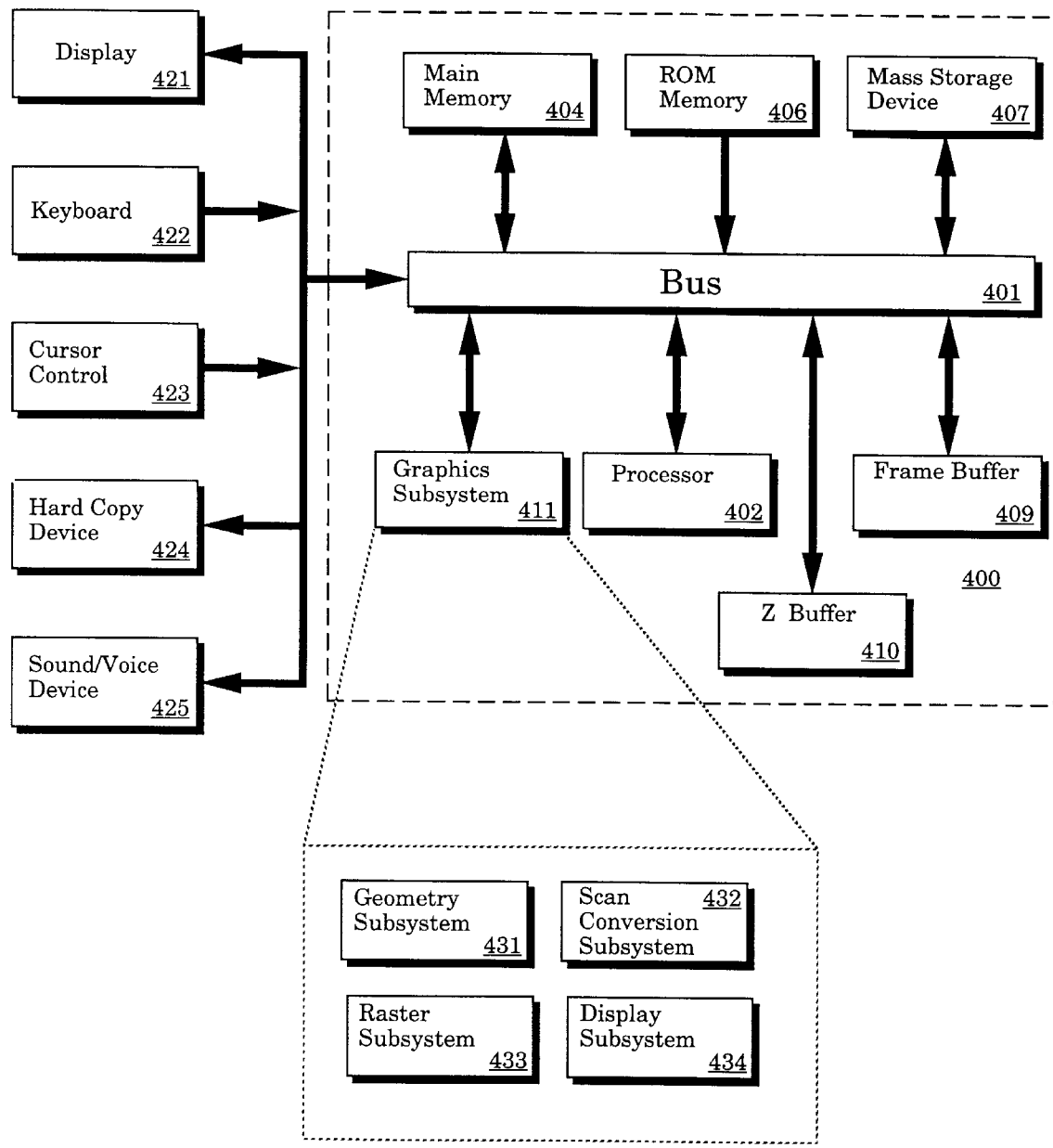
FIG. 4 shows a computer system upon which the present invention may be practiced.

Referring to FIG. 4, a computer system upon which the present invention may be practiced is shown as 400. System 400 includes any computer controlled graphics systems for generating complex or three-dimensional images. Computer system 400 includes a bus 401 for transmitting digital information between the various parts of the computer system. One or more microprocessors 402 are coupled to bus 401 for processing information. The information along with the instructions of how the information is to be processed are stored in a hierarchical memory system comprised of mass storage device 407, read only memory 406, main memory 404, and static random access memory (SRAM) 403. Mass storage device 407 is used to store vast amounts of digital data. The mass storage device 407 can consist one or more hard disk drives, floppy disk drives, optical disk drives, tape drives, CD ROM drives, or any number of other types of storage devices having media for storing data digitally. A read only memory (ROM) 406 is used to store digital data of a permanent basis, such as instructions for the microprocessors. Main memory 404 is used for storing digital data on an intermediate basis. Main memory 404 can be dynamic random access memory (DRAM).

A graphics subsystem 411 is an option which can be included in system 400. Processor 402 provides the graphics subsystem 411 with graphics data, such as drawing commands, coordinate vertex data, and other data related to an object's geometric position, color, texture, shading, and other surface parameters. The object data is processed by graphics subsystem 411 in the following four pipelined stages: geometry subsystem 431, scan conversion subsystem 432, raster subsystem 433, and a display subsystem 434. The geometry subsystem 431 converts the graphical data from processor 402 into a screen coordinate system. It is the function of the geometry subsystem 431 to perform the projection and transformation process to give depth to a displayed object. The resulting primitives (e.g., points, lines, polygons, and meshes) supplied by the geometry subsystem 431 are then supplied to the scan conversion subsystem 432. It is the function of the scan conversion subsystem 432 to then generate pixel data based on these primitives. The scan conversion subsystem 432 performs the interpolation functions to interpolate straight lines so that each intermediate value need not be individually and separately calculated by the geometry subsystem. Next, the pixel data is sent to the raster subsystem 433, whereupon z-buffering, blending, texturing, and anti-aliasing functions are performed. The resulting pixel values are subsequently stored in frame buffer 409, and the Z values are stored in the Z buffer 410. The display subsystem 434 reads the frame buffer 409 and displays the image on monitor 421.

Several other devices may also be coupled to system 400. For example, an alphanumeric keyboard 422 is used for inputting commands and other information to processor 402. Another type of user input device is cursor control device 423 (e.g., a mouse, trackball, joystick, etc.) used for positioning a movable cursor and selecting objects on a computer screen. Another device which may be coupled to bus 401 is a hard copy device 424 (e.g., a laser printer) for printing data or other information onto a tangible medium. Additionally, a sound recording or video option 425 can be coupled to the system 200 to provide multimedia capabilities.

In the present invention, the Z values associated with the primitives are transformed according to standard projection division algorithms in order to give an object the perception of depth. Once transformed, the intermediate Z values are calculated according to standard linear interpolation schemes. The interpolations are performed on Z values with an extended number of N bits (e.g., 32-bit arithmetic). The number N of bits used for the Z values is made large enough so that sufficient resolution is provided in the far field, even at extremely high near-to-far plane ratios. However, once the interpolations have been completed, the Z values are encoded into a lesser number of (N-x) bits. It is these encoded (N-x) bits that are ultimately stored in the Z buffer.

There are numerous different encoding schemes which can be used to encode the Z values for storage. Basically, the encoding scheme should compress the Z values in such a way that preservation of precision in the far field is favored over that in the near field. In other words, more of the bits are stored for Z values corresponding to the far field, and less bits are stored for the Z values corresponding to the near field. Hence, the encoding scheme promotes packing precision in the far field at the expense of the near field in order to compensate for the fact that the transformation process results in the loss of resolution in the far field relative to the near field. Hence, the format used in the computational process (e.g., transformation and interpolation), is different than the format used in the storage process (e.g., encoded Z values). It is highly preferable that the compression process preserves the arithmetic sequentiality of the Z values so that compressed values can be compared with a simple positive integer magnitude comparator to determine relative depths. By preserving the arithmetic sequentiality, there is no need to decompress the stored values when performing depth comparisons.

Figure 5:
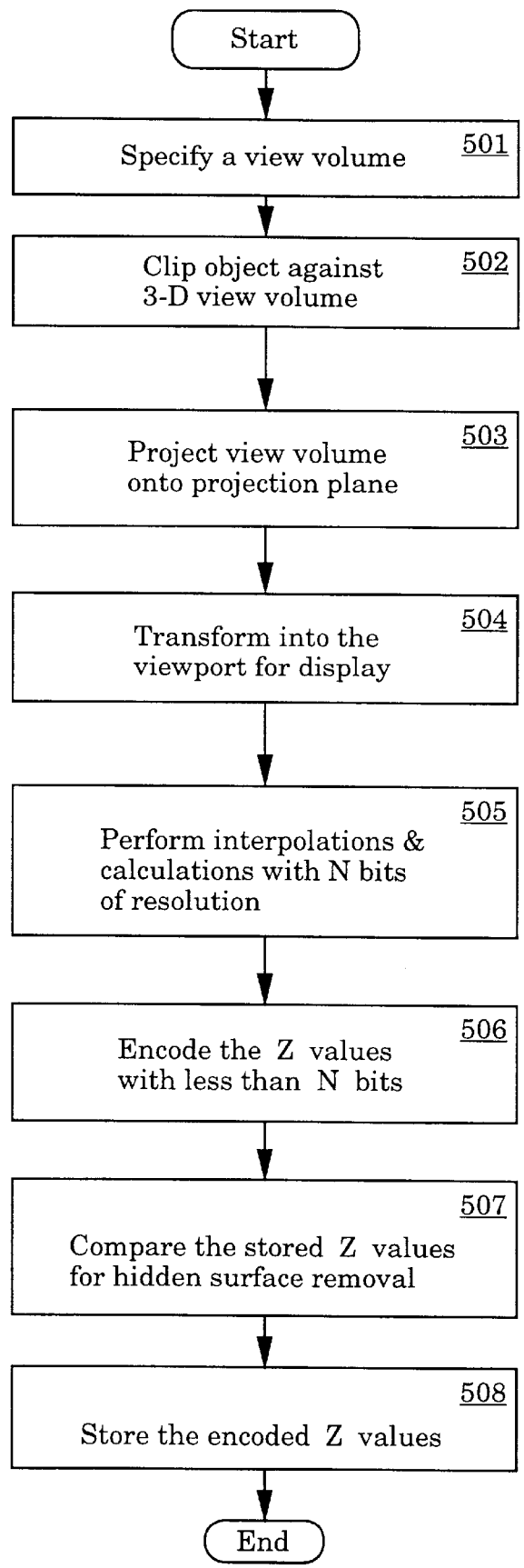
FIG. 5 is a flowchart describing the steps for processing the depth values.

Referring to FIG. 5, a flowchart describing the steps for performing the depth operations is shown. Initially, a view volume in the world is specified, step 501. Next, an object is clipped against this three-dimensional view volume, step 502. The clipped object is projected onto a projection plane, step 503. The intermediate values are interpolated from the transformed primitives, step 505. The interpolation step 505 is performed on Z values having precision of N bits. This precision retains resolution in the far field in spite of the warping effect of the transformation process.

After the Z values have been interpolated, they are encoded to compress the N-bit Z values into a lesser number (N-x) of bits, step 506. It is these compressed (N-x) bit Z values that are ultimately stored into the Z buffer, step 508. In the encoding step of 506, more precision is accorded to the Z values in the far field at the expense of the Z values in the near field. Although the distributions of the encoded Z values are different from that of the original Z values, the encoded Z values, nonetheless, maintain positions of their relative orderings. Thereby, there is no need to decode the stored Z values. The encoded (N-x) bit Z values can be compared against each other to determine their relative depths, step 507. In this manner, high resolution in the far field is achieved without the expense of having to add more memory. In addition, bandwidth is conserved because there is no need to read and write superfluous Z bits from/into the Z buffer.

Figure 6:
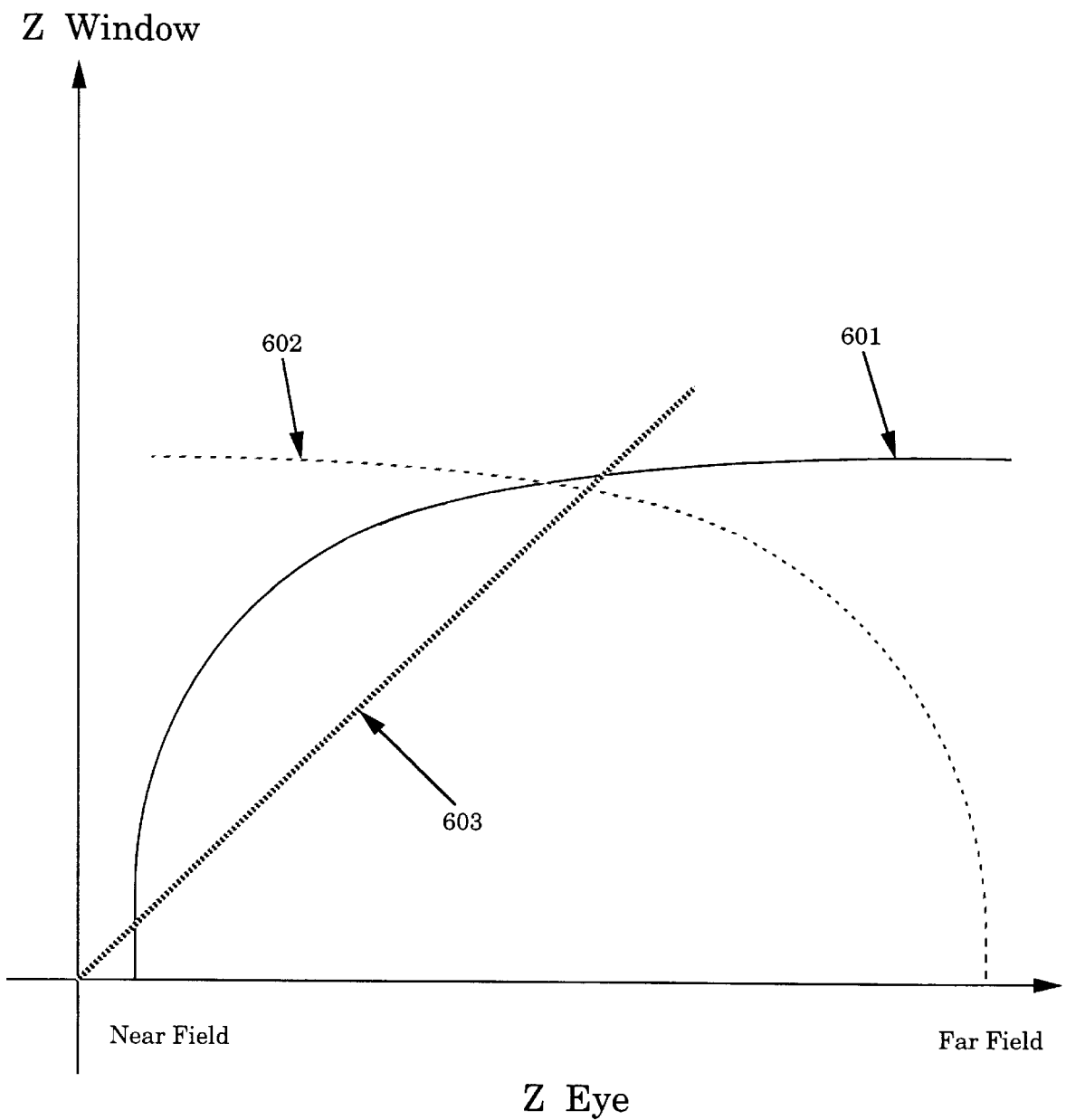
FIG. 6 is a graph plotting the warping effect caused by the transformation process and also plotting a compression scheme.

It should be noted that many different encoding schemes can be used. In one embodiment, a compression scheme is applied that compresses the Z values associated with the near field so that more resolution can be given to the far field. The compression scheme, at the first approximation, is approximately the inverse of the warping effect caused by the transformation. FIG. 6 shows a graph of the warping effect 601 versus a graph of the compression scheme 602. The desired relationship is depicted as a linear line 603.

An analysis of the Z resolution and representation is now presented. The screen space depth coordinate, $Z_s$, is created at the point in rendering computations when perspective division reduces the three dimensional eye coordinate system to the two dimensional screen coordinate system. It is introduced as a means of maintaining a quantity which is a function of eye space depth that is a linear function of screen space x and y. The function of the eye space depth coordinate, $Z_e$, which fulfills these requirements is:

$$Z_s = \alpha + \frac{\beta}{Z_e}$$

This can be shown as follows. Since $Z_e$ is linear in eye space and $Z_s$ is linear in screen space:

$$\frac{dZ_e}{dX_e} = K_1$$

$$\frac{dZ_s}{dX_s} = K_2$$

The eye to screen transformation (assuming normalized viewing parameters) ensures that:

$$X_s = \frac{X_e}{Z_e}$$

Differentiating yields:

$$\frac{dX_s}{dX_e} = \frac{1}{Z_e^2} \quad \frac{dZ_e}{dX_e} = \frac{K_1}{Z_e^2}$$

Combining derivatives yields:

$$\frac{dZ_s}{dZ_e} = \frac{dZ_s}{dX_s} \cdot \frac{dX_s}{dX_e} \cdot \frac{dX_e}{dZ_e} =$$

$$K_2 \left( \frac{K_1}{Z_e^2} \right) \frac{1}{K_1} = \frac{K_2}{Z_e^2} \text{ or } \left( Z_s = \alpha + \frac{\beta}{Z_e} \right)$$

For boundary conditions, the parameters $\alpha$ and $\beta$ are determined by the association of physical depth coordinates with the screen z coordinates specifying the bounds of the unit clipping cube. Thus:

$$Z_s(Z_N) = \alpha + \frac{\beta}{Z_N} = 0$$

and $$Z_s(Z_F) = \alpha + \frac{\beta}{Z_F} = 1$$

Algebraic manipulations leads to:

$$Z_s = \frac{Z_F}{Z_F - Z_N} - \left( \frac{Z_N Z_F}{Z_F - Z_N} \cdot \frac{1}{Z_e} \right)$$

This results in the relation:

$$\frac{dZ_s}{dZ_e} = \frac{Z_N Z_F}{Z_F - Z_N} \cdot \frac{1}{Z_e^2}$$

or $$\frac{dZ_e}{dZ_s} = \frac{Z_F - Z_N}{Z_N Z_F} \cdot Z_e^2$$

The case of an infinite far plane is now considered. If $Z_F$ is allowed to grow without bound, then:

$$Z_s = 1 - \frac{Z_N}{Z_e}$$

This is not to say that with a finite number of bits one can represent an infinite range. What really happens is that the value of 1.0, which cannot actually be reached by a binary fraction, can be used to represent infinity with everything beyond a value of all "1's" being considered to lie between the maximum $Z_E$ and infinity.

The differentials are now considered. Since $Z_N \ll Z_F$:

$$\frac{dZ_e}{dZ_s} \approx \frac{1}{Z_N} \cdot Z_e^2$$

This relation, which is exact for the infinite far plane case, allows one to derive values for incremental $Z_s$ resolution. For the case where $dZ_s$ is $2^{-16}$ the $dZ_e$ at $Z_e = Z_F$ is:

$$dZ_e = \frac{2^{-16}}{Z_N} \cdot Z_F^2$$

A convenient range for $Z_e$ for a ground level, outdoor scene could be a near value of 2 feet and 24.8 miles. The 2 feet represents the true distance of the viewer to the screen, and the 24.8 miles represents a reasonable horizon. In order to cover this scene, a depth range of $2^{-16}$ is required. Given these parameters, $dZ_e$ at $Z_F$ is 12.4 miles. This corresponds to half of the range. In stark contrast, the Z resolution is an incredible sixteen millionths of a foot at the near plane.

Another way to set Z values is to work from a desired minimum incremental value $dZ_e$ and range $Z_F$ to set an appropriate $Z_N$, given a fixed number of bits. This is useful for flight situations where objects generally do not get very close to the screen. If one desires a resolution of 1 foot at 24.8 miles ($2^{-17}$ feet), given a 24 bit Z buffer then:

$$Z_N = \frac{2^{-24}}{2 \cdot dZ_e} Z_F^2 = \frac{2^{-24}}{2} \cdot 2^{2 \cdot 17} = 2^9 = 512 \text{ feet}$$

Often, it is less expensive to iterate a $Z_s$ to a given number of bits than it is to store the same number of bits. This raises the issue of how resolution degradation should be allocated as a function of $Z_e$, given a fixed number of bits in Z buffer storage. A highly desired quality for a compression function, Z', is that it preserve the ordering of all iterated Z values in order to maintain the relative Z positionings. One alternative which has desirable qualities is for resolution to degrade linearly with $Z_e$. In other words:

$$\frac{dZ_e}{dZ'} = K Z_e$$

where, $$Z' = \frac{1}{K_1} \log Z_e + K_2 = \frac{1}{K_1} \log \frac{Z_N}{1 - Z_s \left( 1 - \frac{Z_N}{Z_s} \right)} + K_2$$

The constants can now be set so that zero and one map directly from $Z_s$ to Z'.

$$K_1 = \log \frac{Z_F}{Z_N}$$

and $$K_2 = \frac{\log Z_N}{\log \left( \frac{Z_N}{Z_F} \right)}$$

Incorporating the constants results in:

$$Z' = \frac{\log \left( 1 - Z_s \left[ 1 - \frac{Z_N}{Z_F} \right] \right)}{\log \frac{Z_N}{Z_F}} = \frac{\log \frac{Z_N}{Z_e}}{\log \frac{Z_N}{Z_F}}$$

This formula clearly shows that the encoding is dependent on the near-to-far ratio. Going back to the earlier example with a near-to-far ratio of $2^{-16}$ and a sixteen bit Z' buffer:

$$dZ_e = 11.09 \cdot 2^{-16} \cdot Z_e$$

Thereby, this yields a near resolution of one three thousandth of a foot and a far resolution of 11.09 feet with a smooth degradation in between. Since the near-to-far ratio is generally a power of two, the ratio of logarithms merely implies a change of base. This means that the base two logarithm of the numerator is shifted the appropriate number of places notationally. For a binary number, $Z_s$, the numerator is the two's complement of $Z_s$ added to a version of $Z_s$ shifted down by the exponent of the near-to-far ratio.

Again looking at the previous example with a near-to-far ratio of $2^{16}$:

$$Z' = \frac{\log\left(1 - Z_s\left[1 - \frac{1}{2^{16}}\right]\right)}{-16}$$

The effect of cutting the number of bits in the representation of Z' is shown as:

$$\Delta Z_e = 11.09 \cdot \Delta Z' \cdot Z_e$$

Thus, deleting four bits would increase the increment in $Z_e$ by a factor of sixteen throughout the range with no other side effects. In one embodiment, the shift and add operations prior to the log operation can be eliminated as shown in the slightly modified expression:

$$Z' = \frac{\log(1 - Z_s)}{\log\frac{Z_N}{Z_F}}$$

This allows the logarithmic encoding to be done directly on $(1-Z_s)$. Note that this means that the leading "1's" in $Z_s$ are encoded and the remaining bits are looked up or otherwise used to compute the mantissa. Also, note that since an actual $Z_s$ will never reach 1.0, the log will not go to infinity. The division operation maps the largest value back to 1.

In one embodiment, a floating point compaction is used. Floating point formats assign a certain number of bits to represent an exponent. This specifies the number of bit positions to shift the remaining bits which are referred to as the mantissa. Normally, in arithmetic units, the exponent can be thought of as the number of leading zeroes. However, in this case, it represents the number of leading ones. Generally, an implicit zero would be expected to follow the encoded count of leading ones. Floating point compaction is actually the first step in logarithmic encoding. It gives much of the benefit without the extra expense of the log mantissa calculation. For a given exponent, resolution degrades throughout the range of the mantissa since the precision of $\Delta Z_s$ remains constant while $Z_e$ increases. This degradation can be most significant if only a few bits are available for a significant range, such as 4 feet to 3.1 miles ($2^{12}$ feet). As an example, for the case of a 10-bit buffer with a 6-bit mantissa, the resolution reaches 248 feet per bit of $Z_s$ before the first exponent change.

In figuring the resolution limits with a floating point compaction, the number of mantissa bits is defined as M, and the number of exponent bits is defined as X. A floating point compacted Z value can then represent as many as $(2^X)-1+M$ bits. Iteration is required to support accuracies to this level. As the value of the exponent decreases from its maximum value, the incremental resolution in $Z_s$ decreases by a factor of two. Thus, from the differential $dZ_e/dZ_s$, at the value of $Z_e$ for which the exponent changes, the resolution in $Z_e$ also decreases by a factor of two. This corresponds to the point of worst resolution within the range of $Z_e$ as represented by that exponent value.

Table 1 below expresses some of the key quantities associated with a 14-bit Z buffer having three exponent bits and eleven mantissa bits.

TABLE 1

14-bit Z Buffer Compression

| Exponent | Z Values | $dZ_s$ | Max $Z_s$ | Max $(Z_e/Z_N)$ | $dZ_e/Z_N$ |
|---|---|---|---|---|---|
| 0 | .0M | $2^{-12}$ | $1-2^{-1}$ | $2^1$ | $2^{-10}$ |
| 1 | .10M | $2^{-13}$ | $1-2^{-2}$ | $2^2$ | $2^{-9}$ |
| 2 | .110M | $2^{-14}$ | $1-2^{-3}$ | $2^3$ | $2^{-8}$ |
| 3 | .1110M | $2^{-15}$ | $1-2^{-4}$ | $2^4$ | $2^{-7}$ |
| 4 | .11110M | $2^{-16}$ | $1-2^{-5}$ | $2^5$ | $2^{-6}$ |
| 5 | .111110M | $2^{-17}$ | $1-2^{-6}$ | $2^6$ | $2^{-5}$ |
| 6 | .1111110M | $2^{-18}$ | $1-2^{-7}$ | $2^7$ | $2^{-4}$ |
| 7 | .1111111M | $2^{-18}$ | $1-2^{-18}$ | $2^{18}$ | $2^{18}$ |

Assuming that an infinite far plane formulation is selected, the following description pertains to the effects and visualization of setting the near plane coordinate. Referring back to Table 1 above, it can be seen that the ratio of $dZ_e$ to $Z_e$ is a constant. This constant is equal to two raised to the number of mantissa bits. In the above example, a log scale was chosen for storage purposes. Consequently, the distance between objects (or occulting parts of an object), which is necessary to prevent their aliasing to the same Z value, is proportional to the object's distance from the viewer. Setting the near plane has no effect upon this factor.

Instead, the effect of the infinite far plane is not to make all objects representable, but to make all objects beyond the final tick of the $Z_s$ scale as being aliased into the same value. This occurs at the $Z_e$ value that is two raised to the effective number of bits at the maximum exponent times $Z_N$. It is assumed that the number of bits iterated is also equal to the number of effective bits stored at the maximum exponent value. Thus, there are three regions in the Z dimension: 1) those in front of the near plane, which are not representable; 2) those between the near plane and the nearest point represented by the largest possible value; and 3) those out to infinity, which are represented by the largest possible value.

One specific compression scheme is now described. In the currently preferred embodiment of the compression scheme, N-bit Z values are represented with less than N bits by breaking the value into a set of exponent bits followed by a set of mantissa bits. If the lower values correspond to the near field, the goal is to compress the lower bits into values having lesser bits, while the higher values are given more bits of representation. This is achieved by setting the exponent and mantissa bits in response to the actual N-bit values. Table 2 below shows how 32-bit Z values are compressed into 16 bit values for storage.

TABLE 2

Compression of 32-Bit Z Values Into 16 Bits

| 32-Bit Z Value | 4-Bit Exponent | 12-Bit Mantissa | Precision |
|---|---|---|---|
| 0xxx xxxx xxxx xxxx . . . xxxx | 0000 | 30, 29, 28, . . . 19 | 13 |
| 10xx xxxx xxxx xxxx . . . xxxx | 0001 | 29, 28, 27, . . . 18 | 14 |
| 110x xxxx xxxx xxxx . . . xxxx | 0010 | 28, 27, 26, . . . 17 | 15 |
| 1110 xxxx xxxx xxxx . . . xxxx | 0011 | 27, 26, 25, . . . 16 | 16 |
| 1111 0xxx xxxx xxxx . . . xxxx | 0100 | 26, 25, 24, . . . 15 | 17 |
| 1111 10xx xxxx xxxx . . . xxxx | 0101 | 25, 24, 23, . . . 14 | 18 |
| 1111 110x xxxx xxxx . . . xxxx | 0110 | 24, 23, 22, . . . 13 | 19 |
| 1111 1110 xxxx xxxx . . . xxxx | 0111 | 23, 22, 21, . . . 12 | 20 |
| 1111 1111 0xxx xxxx . . . xxxx | 1000 | 22, 21, 20, . . . 11 | 21 |
| 1111 1111 10xx xxxx . . . xxxx | 1001 | 21, 20, 19, . . . 10 | 22 |
| 1111 1111 110x xxxx . . . xxxx | 1010 | 20, 19, 18, . . . 9 | 23 |
| 1111 1111 1110 xxxx . . . xxxx | 1011 | 19, 18, 17, . . . 8 | 24 |
| 1111 1111 1111 0xxx . . . xxxx | 1100 | 17, 17, 16, . . . 7 | 25 |
| 1111 1111 1111 10xx . . . xxxx | 1101 | 17, 16, 15, . . . 6 | 26 |

TABLE 2-continued

Compression of 32-Bit Z Values Into 16 Bits

| 32-Bit Z Value | 4-Bit Exponent | 12-Bit Mantissa | Precision |
|---|---|---|---|
| 1111 1111 1111 110x . . . xxxx | 1110 | 16, 15, 14, . . . 5 | 27 |
| 1111 1111 1111 111x . . . xxxx | 1111 | 16, 15, 14, . . . 5 | 27 |

Basically, if the first bit (MSB) of the 32-bit Z value is a 0, then the exponent is a 0, and the 12-bit mantissa is comprised of bits 30–19 of the original 32-bit Z value. The remaining 19 bits (i.e., bits 19–0) of the 32-bit Z value are discarded. In this instance, the exponent represents only one bit of resolution (i.e., the MSB=0), and the mantissa represents twelve bits of resolution (i.e., bits 30–19). This yields a total precision of 13 bits after the compression process. As an example, if the original 32-bit Z value were "0110 1001 1110 0010 1111 0111 1001 1001" then the resulting compressed 16-bit Z value that is stored would be "0000 1101 0011 1100". The remaining nineteen bits "0101 1110 1111 0011 001" are discarded.

However, if the first bit of the 32-bit Z value is a 1 and the second bit is a 0, then the exponent is set to a value of 1 and the mantissa is comprised of bits 29–18 of the original 32-bit Z value. The remaining eight bits (i.e., bits 18–0) of the 32-bit value are discarded. Hence, the exponent represents two bits (i.e., "10") of precision, and the mantissa represents twelve bits (i.e., bits 29–18) of precision. The total precision for this case is fourteen bits.

In short, the more leading "1's" there are in the original Z value, the greater the precision that is represented by the 4-bit exponent. In the last two cases (i.e., 1111 1111 1111 110x . . . xxxx and 1111 1111 1111 110x . . . xxxx), there are twenty-seven bits of precision. Therefore, as the 32-bit Z values become larger, thereby signifying a greater distance away from the viewer, the corresponding compressed Z values are stored with greater precision and vice versa. This particular compression scheme is used to encode the Z values because of the simplicity of its design.

Figure 7:
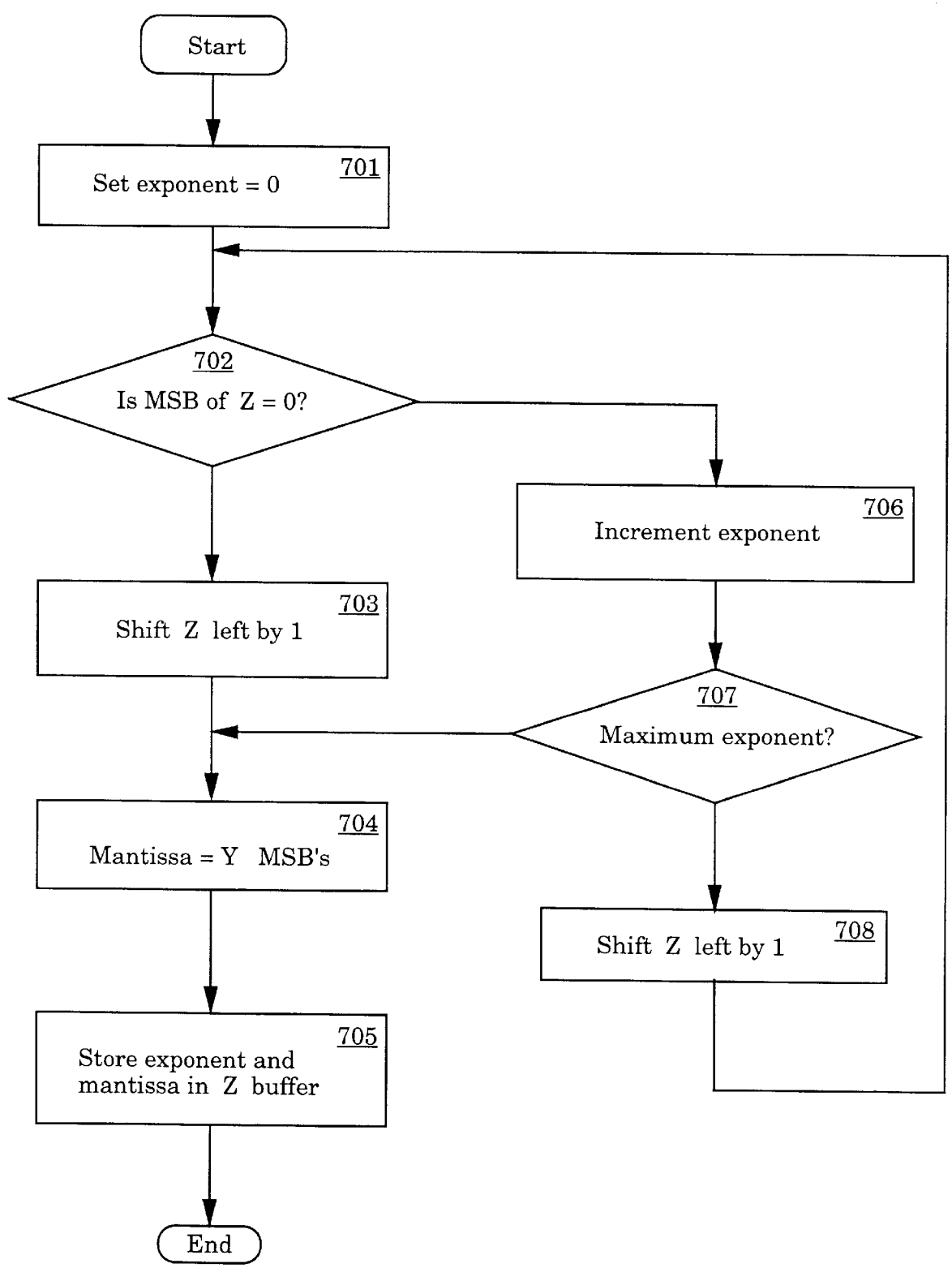
FIG. 7 is a flowchart describing the steps for one of the encoding schemes that can be applied to depth values before storage into memory.

FIG. 7 is a flowchart describing the steps for performing Z compression. The compressed Z value is comprised of an exponent and a mantissa. The exponent is initialized to a value of 0, step 701. A determination is made as to whether the most significant bit (MSB) of the Z value is 0, step 702. If the MSB happens to be 0, step 703 is executed. Step 703 shifts the Z value to the left by 1 bit. Next, the mantissa is set to the value of a number (Y) of MSB's of the Z value, step 704. Thereupon, the exponent bits and the mantissa bits are stored in the Z buffer, step 705. However, if it were determined in step 702 that the MSB of Z is not 0, then step 706 is executed. In step 706, the exponent is incremented by 1. After the exponent has been incremented, a determination is made as to whether the exponent is now at its maximum number (i.e., one short of overflow). The maximum 3-bit exponent is 7; the maximum 4-bit exponent is 15; the maximum 5-bit exponent is 31; etc. If it is determined that the exponent is at its maximum number, steps 704 and 705 are executed. Otherwise, step 702 is repeated. For each original Z value, steps 701–708 are performed in order to compress these values before storage. Moreover, these same steps can be applied to Z values corresponding to subsample points as well.

However, in some three-dimensional graphics applications, the near-to-far plane ratio is not that great. In these cases, the warping effect is not that pronounced. Indeed, there is no warping at all associated with othographic projections. Under these circumstances, the precision in the near field should be maintained. Hence the ideal compression scheme would automatically grant greater precision in the far field when there is a great amount of warping, and yet, does not sacrifice too much precision when there is minimal warping. One such compression scheme is given by Table 3 below.

TABLE 3

Compression Scheme Having A Variable Exponent

| 24-Bit Z Value | Exponent | Mantissa | Precision |
|---|---|---|---|
| xxx xxx xxx xxx . . . xxx | 0 (1 bit) | bits 23–9 | 15 bits |
| 111 xxx xxx xxx . . . xxx | 10 (2 bits) | bits 20–7 | 17 bits |
| 111 111 xxx xxx . . . xxx | 110 (3 bits) | bits 17–5 | 19 bits |
| 111 111 111 xxx . . . xxx | 1110 (4 bits) | bits 14–3 | 21 bits |
| 111 111 111 111 . . . xxx | 1111 (4 bits) | bits 11–0 | 24 bits |

In the compression scheme shown in Table 3, a 24-bit Z value is compressed into a final 16-bit Z value for storage. The precision in the near plane is 15 bits—only 9 bits of resolution are lost. In the far plane, the entire 24-bit precision is retained. In this alternate compression scheme, the number of bits used to represent the exponent is variable. Since the number of bits used to represent the exponent increases, the mantissa has to be shifted by more than one place for each increase in the exponent. In the compression scheme shown in Table 3, the mantissa is shifted three places each time the exponent is increased.

This particular compression scheme operates as follows. If the three MSB's of the 24-bit Z value are not "111", then the exponent is represented by simply setting a single bit to 0. The remaining fifteen bits of the compressed 16-bit value are set to equal to bits 23–9 of the original, uncompressed 24-bit Z value. Hence, the single exponent bit has no precision because it does not represent any bit in the original 24-bit value. The mantissa has fifteen bits of precision because it represents bits 23–9 of the original 24-bit value. This yields a total of 16 bits of precision.

If the first three MSB's are "111" and the next three bits are not "111," the exponent is represented by two bits: "10". The remaining fourteen bits are set to equal bits 20–7 of the original 24-bit Z value. In this instance, three bits of precision are gained by the exponent because it represent a value of "111" of the original 24-bit value. The mantissa has fourteen bits of precision (i.e., bits 20–7 of the 24-bit value), thereby yielding a total of seventeen bits of precision. This process is repeated for 24-bit Z values having the first six, nine, and twelve MSB's being all "1's".

However, there are some redundancies inherent in the above compression scheme. It was defined that an exponent of "0" represents the eight states whereby the three MSB's are "xxx." Yet, "xxx" can never be in the eighth state "111." Otherwise, the exponent would have been 10. Consequently, one of the eight states is wasted. Similarly, an exponent of "10" represents the eight states whereby the first six MSB's are "111 xxx." However, it can never be that the exponent of "10" represents the case of "111 111." Again, coding space is wasted.

A more efficient encoding process is now described. The redundancies of the compression scheme described above are eliminated. Table 4 below, shows how 24-bit Z values are more efficiently encoded into 16-bit Z values for storage.

TABLE 4

An Efficient Compression Scheme

| 24-Bit Z Value | Exponent | Mantissa | Precision |
|---|---|---|---|
| xxx xxx xxx xxx . . . xxx | 0 | bits 23–9 | 15 bits |
| 110 xxx xxx xxx . . . xxx | 0 | 11+bits 20–8 | 16 bits |
| 111 xxx xxx xxx . . . xxx | 10 | bits 20–7 | 17 bits |
| 111 110 xxx xxx . . . xxx | 10 | 11+bits 17–6 | 18 bits |
| 111 111 xxx xxx . . . xxx | 110 | bits 17–5 | 19 bits |
| 111 111 110 xxx . . . xxx | 110 | 11+bits 14–4 | 20 bits |
| 111 111 111 xxx . . . xxx | 1110 | bits 14–3 | 21 bits |
| 111 111 111 110 . . . xxx | 1110 | 11+bits 11–2 | 22 bits |
| 111 111 111 111 . . . xxx | 1111 | bits 11–0 | 24 bits |

In this compression scheme, when the exponent is 0 and the first 3-bit set of the 24-bit Z value is "110," the mantissa is encoded with the value "11" plus bits 20–8. The "11" actually represents three bits of the original 24-bit Z value. The "11" represents a value of "110" because the bit following the "11" must be a "0". Otherwise, if the bit were a "1," this would result in a "111" combination, and the exponent would have been encoded as "10" instead of "0." Thus, it follows that an exponent of "0" and a mantissa having the two MSB's="11" represents that bits 23–21 of the original 24-bit Z value is "110." Likewise, an exponent of "10" and a mantissa having the five MSB's="111 11," represents that bits 23–18 of the original 24-bit Z value is "111 110." Similarly, an exponent of "110" and a mantissa having the eight MSB's="111 111 11," represents that bits 23–15 of the original 24-bit Z value is "111 111 110." And an exponent of "1110" and a mantissa having the eight MSB's="111 111 111 11," represents that bits 23–12 of the original 24-bit Z value is "111 111 111 110".

It should be noted that many different types of encoding schemes can be applied to the present invention. In one embodiment, the type of encoding scheme is chosen based on the near-to-far plane ratio. If this ratio is large, an encoding scheme that favors precision in the far field is chosen. However, if this ratio is small, a different encoding scheme that is not as aggressive in reducing the near field resolution, is chosen.

What is claimed is:

1. In an apparatus for displaying objects visually perceived as being three-dimensional, a method of processing depth values representing relative depths of pixels or subpixels of the objects, wherein the method is comprised of the steps of:
    transforming the depth values of vertices corresponding to a primitive to generate transformed depth values, wherein the transformed depth values have N bits of resolution;
    generating intermediate depth values by interpolating at least two of the transformed depth values, wherein the intermediate depth values have N bits of resolution;
    encoding the intermediate depth values into encoded depth values having less than N bits of resolution;
    comparing the encoded depth values to determine whether one object is in front of another object;
    storing the encoded depth values in memory that correspond to the objects or portions of objects that are visible.

2. The method of claim 1, wherein an encoded depth value of an object in a near plane corresponds to X number of bits of a pre-encoded depth value of the object in the near plane and an encoded depth value of an object in a far plane corresponds to more than X number of bits of a pre-encoded depth value of the object in the far plane.

3. The method of claim 1, wherein the encoding step is comprised of the steps of:
    representing the (N-x) bit values as an exponent and a mantissa;
    assigning the exponent a specific value in response to the depth value having a pre-determined code pattern;
    setting the mantissa to certain bits of the depth value according to the value assigned to the exponent.

4. The method of claim 3, wherein the exponent has a variable number of bits.

5. The method of claim 4 further comprising the step of encoding a "110" depth value pattern as a specific exponent plus a mantissa of "11" plus a certain number of bits of the depth value.

6. The method of claim 1, wherein the depth values correspond to pixels.

7. The method of claim 1, wherein the depth values correspond to subpixels.

8. The method of claim 1 further comprising the steps of:
    determining a near-to-far field ratio;
    selecting an encoding scheme according to the near-to-far field ratio.

9. The method of claim 1, wherein the encoding step performs a logarithmic function.

10. An apparatus for rendering a three-dimensional object comprising:
    a memory for storing original Z values representing relative depths;
    a processor coupled to the memory for projecting the original Z values to give the object a perception of depth;
    an interpolator coupled to the processor for generating interpolated Z values by interpolating a plurality of the original Z values;
    an encoder coupled to the interpolator for encoding the interpolated Z values to generate encoded Z values, wherein the encoded Z values have less bits than that of the interpolated Z values;
    a Z buffer coupled to the encoder for storing the encoded Z values;
    a comparator coupled to the Z buffer for determining the relative depths of images based on the encoded Z values.

11. The apparatus of claim 10, wherein an encoded depth value of an object closer to a viewer corresponds to X number of bits of a pre-encoded depth value for the object closer to the viewer and an encoded depth value of an object farther away from the viewer corresponds to more than X number of bits of a pre-encoded depth value of the object.

12. The apparatus of claim 10, wherein the encoder represents the encoded Z values as an exponent and a mantissa, assigns the exponent a specific value in response to the interpolated Z value having a pre-determined code pattern, and sets the mantissa to certain bits of the interpolated Z value according to the exponent.

13. The apparatus of claim 12, wherein the exponent can have a variable number of bits.

14. The apparatus of claim 13, wherein the encoder encodes a "110" interpolated Z value pattern as a specific exponent plus a mantissa of "11" plus a certain number of bits of the interpolated Z value.

15. The apparatus of claim 10, wherein the comparator reads the encoded Z values from the Z buffer and performs an integer compare on the encoded Z values.

16. The apparatus of claim 10, wherein the encoder performs a logarithmic encoding.

17. In a computer system, a method of displaying three-dimensional objects, comprising the steps of:
  specifying a three-dimensional view volume and a projection plane;
  clipping the objects against the view volume;
  projecting the view volume onto the projection plane;
  transforming the objects into a viewport for display;
  interpolating Z values using N bits of data per pixel;
  encoding the Z values into a format having less than N bits of data per pixel;
  storing encoded Z values into a memory;
  reading the encoded Z values from the memory;
  comparing the Z values read from the memory to determine relative depths of the objects;
  storing the Z values in the format having less than N bits of data per pixel.

18. The method of claim 17, wherein the encoding step represents more bits of an unencoded Z value of an object farther away from a viewer and the encoding step represents less bits of an unencoded Z value of an object that is closer to the viewer.

19. The method of claim 17, wherein the encoding step is comprised of the steps of:
  representing the Z value as an exponent and a mantissa;
  assigning the exponent a specific value in response to the Z value having a pre-determined code pattern;
  setting the mantissa to certain bits of the Z value according to the value assigned to the exponent.

20. The method of claim 19, wherein the exponent can have a variable number of bits.

21. The method of claim 20 further comprising the step of encoding a "110" Z value pattern as a specific exponent plus a mantissa of "11" plus a certain number of bits of the Z value.

22. The method of claim 17, wherein the encoding step performs a logarithmic function.

* * * * *